United States Patent
Wang et al.

(10) Patent No.: US 10,541,023 B2
(45) Date of Patent: Jan. 21, 2020

(54) DATA LINE CONTROL CIRCUIT USING WRITE-ASSIST DATA LINE COUPLING AND ASSOCIATED DATA LINE CONTROL METHOD

(71) Applicant: MEDIATEK INC., Hsin-Chu (TW)

(72) Inventors: Chia-Wei Wang, Taichung (TW); Yi-Te Chiu, Hsinchu (TW); Wen-Pin Hsieh, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 16/019,464

(22) Filed: Jun. 26, 2018

(65) Prior Publication Data

US 2019/0074054 A1 Mar. 7, 2019

Related U.S. Application Data

(60) Provisional application No. 62/553,940, filed on Sep. 4, 2017.

(51) Int. Cl.
*G11C 11/41* (2006.01)
*G11C 11/419* (2006.01)
*G11C 5/00* (2006.01)

(52) U.S. Cl.
CPC .............. *G11C 11/419* (2013.01); *G11C 5/00* (2013.01)

(58) Field of Classification Search
CPC ................................. G11C 11/419; G11C 5/00
See application file for complete search history.

(56) References Cited

U.S. PATENT DOCUMENTS

| | | | | |
|---|---|---|---|---|
| 7,944,458 B2* | 5/2011 | Kwon | ................... | G09G 3/2011 345/690 |
| 9,030,863 B2* | 5/2015 | Gulati | ................... | G11C 11/419 365/156 |
| 9,245,602 B2* | 1/2016 | Joshi | ........................ | G11C 8/08 |
| 9,406,351 B2* | 8/2016 | Stansfield | ................. | G11C 7/12 |
| 10,236,055 B1* | 3/2019 | Kumar | ...................... | G11C 5/06 |
| 2004/0156230 A1* | 8/2004 | Satomi | .................. | G11C 11/413 365/154 |
| 2016/0267952 A1 | 9/2016 | Kolar | | |

FOREIGN PATENT DOCUMENTS

EP     3 190 590 A1    7/2017

* cited by examiner

*Primary Examiner* — Vanthu T Nguyen
(74) *Attorney, Agent, or Firm* — Winston Hsu

(57) ABSTRACT

A data line control circuit has a data line driving circuit and a write-assist data line driving circuit. The data line driving circuit is used to drive differential data lines during a write operation of at least one memory cell. The write-assist data line driving circuit is used to drive at least one write-assist data line during the write operation of the at least one memory cell, wherein the at least one write-assist data line is isolated from the differential data lines, and is driven to have a first voltage transition from a first voltage level to a second voltage level, such that one of the differential data lines has a second voltage transition from a third voltage level to a fourth voltage level that is induced by the first voltage transition via capacitive coupling.

18 Claims, 4 Drawing Sheets

US 10,541,023 B2

DATA LINE CONTROL CIRCUIT USING WRITE-ASSIST DATA LINE COUPLING AND ASSOCIATED DATA LINE CONTROL METHOD

CROSS REFERENCE TO RELATED APPLICATIONS

This application claims the benefit of U.S. provisional application No. 62/553,940, filed on Sep. 4, 2017 and incorporated herein by reference.

BACKGROUND

The present invention relates to writing bits into memory cells, and more particularly, to a data line control circuit using write-assist data line coupling and an associated data line control method.

Static random access memory (SRAM) and dynamic random access memory (DRAM) are classified as volatile memories. Compared to the DRAM which requires a periodic refresh operation, the SRAM is more suitable for a high speed and low power circuit design due to the fact that SRAM cells have the advantageous feature of holding data without requiring a periodic refresh operation. For example, embedded SRAM is particularly popular in high speed communication applications, image processing applications and system on chip (SoC) applications.

One SRAM cell may be implemented using a plurality of transistors. Taking a typical six-transistor (6T) SRAM cell for example, it includes two access transistors (or called pass-gate transistors) that may be N-channel metal-oxide semiconductor (NMOS) transistors. The gates of both access transistors are coupled to a word line (WL). The drain of one access transistor is coupled to a bit line (BL), and the source of the one access transistor is coupled to gates of transistors of cross-coupled inverters. The drain terminal of the other access transistor is coupled to a complementary bit line (BLB), and the source of the other access transistor is coupled to gates of transistors of the cross-coupled inverters. In deep sub-micron technology, the lowered word line voltage level affects the write capability of the SRAM cell. That is, the turn-on voltage $V_{on}$ (i.e., $V_{gs}-V_{th}$) of the access transistor is decreased, thus degrading the write capability of the SRAM cell. More specifically, as Moore's law moves to the FinFET technology, controlling the sizing of transistors to enhance the write capability of the SRAM cell is no longer feasible. Hence, a write-assist scheme becomes a must for the SRAM design. A negative-bit-line (NBL) scheme is one of the most popular write-assist schemes. During a write operation of the SRAM cell, a negative voltage is provided to a bit line (e.g., BL or BLB) to improve the turn-on voltage $V_{on}$ (i.e., $V_{gs}-V_{th}$) of an access transistor coupled to the bit line (e.g., BL or BLB). However, the traditional NBL scheme adopts a MOS capacitor (MOSCAP) as a charge-pumping capacitor, and is neither area-efficient nor power-efficient.

Thus, there is a need for an innovative write-assist scheme which is capable of providing a negative voltage to a bit line (e.g., BL or BLB) without using MOS capacitor(s).

SUMMARY

One of the objectives of the claimed invention is to provide a data line control circuit using write-assist data line coupling and an associated data line control method.

According to a first aspect of the present invention, an exemplary data line control circuit is disclosed. The exemplary data line control circuit includes a data line driving circuit and a write-assist data line driving circuit. The data line driving circuit is arranged to drive differential data lines during a write operation of at least one memory cell, wherein the differential data lines comprise a first data line and a second data line; and during the write operation of said at least one memory cell, differential bit lines of said at least one memory cell are coupled to the differential data lines, respectively. The write-assist data line driving circuit is arranged to drive at least one write-assist data line during the write operation of said at least one memory cell, wherein during the write operation of said at least one memory cell, said at least one write-assist data line is isolated from the differential data lines and is driven to have a first voltage transition from a first voltage level to a second voltage level, and one of the first data line and the second data line has a second voltage transition from a third voltage level to a fourth voltage level that is induced by the first voltage transition via capacitive coupling between said at least one write-assist data line and said one of the first data line and the second data line.

According to a second aspect of the present invention, an exemplary data line control method is disclosed. The exemplary data line control method includes: driving differential data lines during a write operation of at least one memory cell, wherein the differential data lines comprise a first data line and a second data line; and during the write operation of said at least one memory cell, differential bit lines of said at least one memory cell are coupled to the differential data lines, respectively; and driving at least one write-assist data line during the write operation of said at least one memory cell, wherein during the write operation of said at least one memory cell, said at least one write-assist data line is isolated from the differential data lines and is driven to have a first voltage transition from a first voltage level to a second voltage level, and one of the first data line and the second data line has a second voltage transition from a third voltage level to a fourth voltage level that is induced by the first voltage transition via capacitive coupling between said at least one write-assist data line and said one of the first data line and the second data line.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
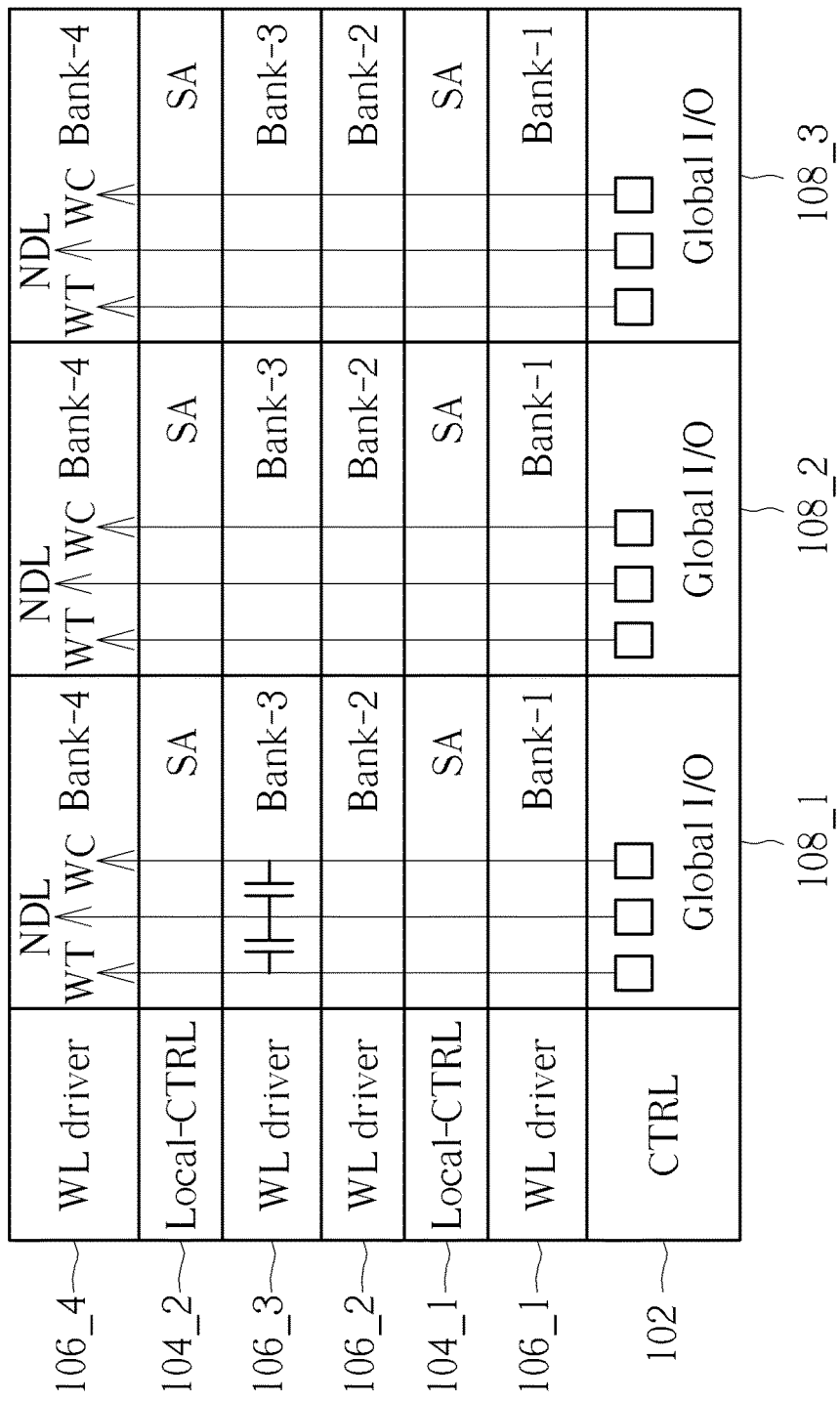
FIG. 1 is a diagram illustrating a floor plan of an SRAM according to an embodiment of the present invention.

FIG. 1 is a diagram illustrating a floor plan of an SRAM according to an embodiment of the present invention. The SRAM 100 includes a plurality of SRAM cells and a memory peripheral circuit. By way of example, but not limitation, the SRAM cells may be typical 6T SRAM cells. The SRAM cells maybe arranged in a plurality of banks Bank-1, Bank-2, Bank-3, and Bank-4. The memory peripheral circuit is used to read a bit from and/or write a bit into any of the SRAM cells. The memory peripheral circuit may include a plurality of sense amplifiers (denoted by "SA"), a control circuit (denoted by "CTRL") 102, a plurality of local control circuits (denoted by "Local-CTRL") 104_1, 104_2, a plurality of word line driving circuits (denoted by "WL driver") 106_1, 106_2, 106_3, 106_4, and a plurality of global input/output circuits (denoted by "Global I/O") 108_1, 108_2, and 108_3.

The same sense amplifier SA may be shared by SRAM cells in different banks. In this embodiment, bits stored in SRAM cells in banks Bank-1 and Bank-2 can be read through the same sense amplifier SA, and bits stored in SRAM cells in banks Bank-3 and Bank-4 can be read through the same sense amplifier SA. Sense amplifiers SA shared by SRAM cells in banks Bank-1 and Bank-2 may be controlled by the local control circuits 104_1. Sense amplifiers SA shared by SRAM cells in banks Bank-3 and Bank-4 may be controlled by the local control circuits 104_2. Word lines of SRAM cells in the bank Bank-1 may be driven by the word line driving circuit 106_1. Word lines of SRAM cells in the bank Bank-2 maybe driven by the word line driving circuit 106_2. Word lines of SRAM cells in the bank Bank-3 may be driven by the word line driving circuit 106_3. Word lines of SRAM cells in the bank Bank-4 may be driven by the word line driving circuit 106_4. The global input/output circuits 108_1, 108_2, 108_3 may be controlled by the control circuit 102.

Each of the global input/output circuits 108_1-108_3 is coupled to a plurality of global metal lines, each being routed to multiple banks in the SRAM 100. That is, each of the global metal lines can be shared by SRAM cells in different banks of the SRAM 100. For example, the global metal lines connected to each global input/output circuit may include differential data lines WT and WC that are complementary to each other under a write mode. When the data line WT is driven to have a logic high level, the complementary data line WC is driven to have a logic low level; and when the data line WT is driven to have a logic low level, the complementary data line WC is driven to have a logic high level. The differential data lines WT and WC can be used to set differential bit lines of one or more SRAM cells under a write mode.

Figure 2:
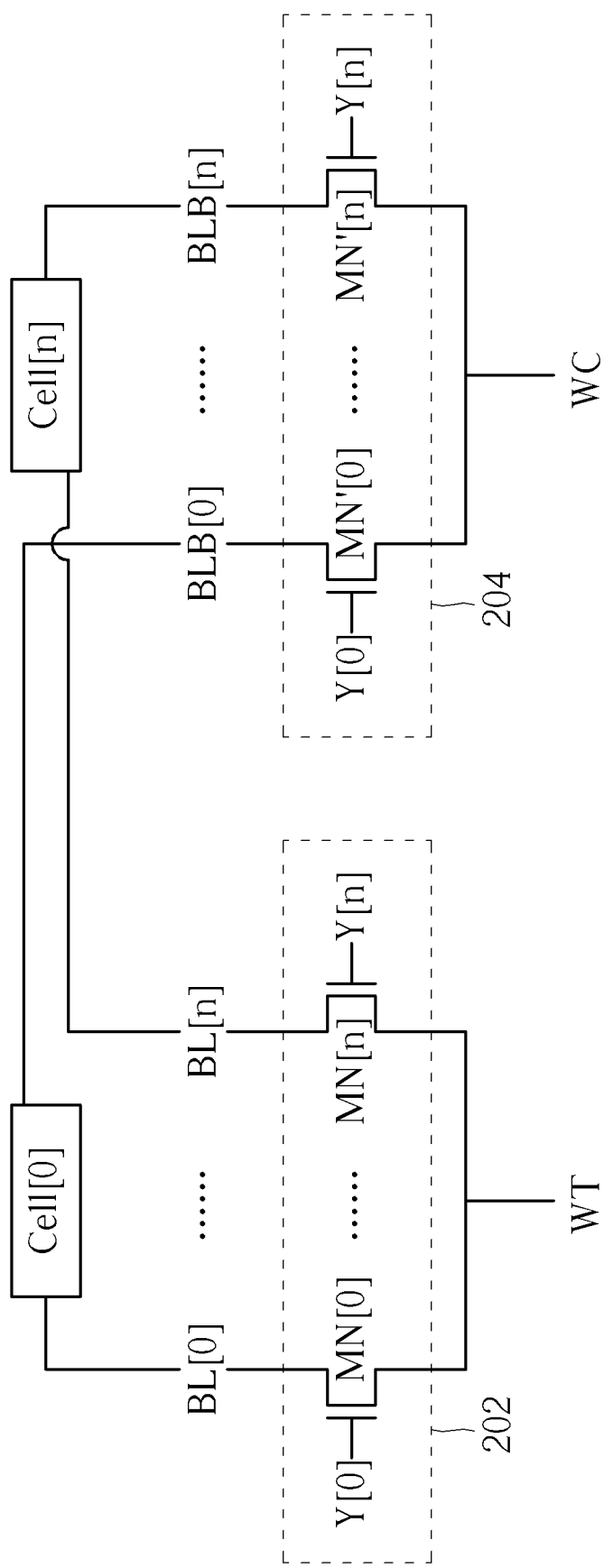
FIG. 2 is a diagram illustrating differential data lines WT and WC shared by different banks and differential bit lines of SRAM cells in one bank according to an embodiment of the present invention.

FIG. 2 is a diagram illustrating differential data lines WT and WC shared by different banks and differential bit lines of SRAM cells in one bank according to an embodiment of the present invention. Suppose that there are a plurality of SRAM cells Cell [0]-Cell [n] with differential bit lines BL[0]-BL[n], BLB[0]-BLB[n] that can be set by using the same differential data lines WT and WC, where differential bit lines BL[0] and BLB[0] are coupled to access transistors (pass-gate transistors) of the SRAM cell Cell [0], and the differential bit lines BL[n] and BLB[n] are coupled to access transistors (pass-gate transistors) of the SRAM cell Cell[n]. As shown in FIG. 1, the differential data lines WT and WC are global metal lines routed to multiple banks. One bit line decoder 202 is a multiplexer coupled between the data line WT and bit lines BL[0]-BL[n]. Another bit line decoder 204 is a multiplexer coupled between the data line WC and bit lines BLB[0]-BLB[n]. The bit line decoder 202 includes NMOS transistors MN[0]-MN[n] controlled by control signals Y[0]-Y[n], respectively. The bit line decoder 204 includes NMOS transistors MN' [0]-MN' [n] controlled by the control signals Y[0]-Y[n], respectively. When the NMOS transistors MN[0] and MN'[0] are both turned on by the control signal Y [0], the differential bit lines BL [0] and BLB[0] of the SRAM cell Cell [0] are set by the differential data lines WT and WC, respectively. When the NMOS transistors MN[n] and MN' [n] are both turned on by the control signal Y [n], the differential bit lines BL[n] and BLB[n] of the SRAM cell Cell[n] are set by the differential data lines WT and WC, respectively. Hence, with proper settings of bit line decoders 202 and 204, differential bit lines of SRAM cell (s) may be coupled to the differential data lines WT and WC during a write operation of the SRAM cell(s).

The major difference between the proposed SRAM design and the conventional SRAM design is that the global metal lines connected to each global input/output circuit further include at least one write-assist data line NDL that is isolated from the differential data lines WT and WC. It should be noted that only the global metal lines pertinent to the present invention are shown in FIG. 1. In addition to differential data lines WT and WC and write-assist data line NDL, an SRAM design may have other global metal lines.

Since the write-assist data line NDL is isolated from the adjacent data lines WT and WC and the data lines WT and WC and the write-assist data line NDL are metal lines, capacitive coupling exists between the write-assist data line NDL and the data line WT, and capacitive coupling exists between the write-assist data line NDL and the data line WC. In this embodiment, the write-assist data line NDL is a dummy data line that is mainly used to introduce global wire coupling and is not connected to a bit line of any SRAM cell under a write mode. For clarity and simplicity, a pair of differential data lines WT and WC is capacitively coupled to only a single write-assist data line NDL. However, this is for illustrative purposes only, and is not meant to be a limitation of the present invention. In some embodiments of the present invention, a capacitive coupling source for a pair of differential data lines WT and WC may include more than one write-assist data line NDL. With a proper arrangement of write-assist data lines NDL and differential data lines WT and WC, a capacitance value resulting from capacitive coupling between the data line WT and adjacent write-assist data lines NDL may have a larger value to meet the design requirement, and a capacitance value resulting from capacitive coupling between the data line WC and adjacent write-assist data lines NDL may have a larger value meet the design requirement. To put it simply, any memory design (e.g., SRAM design) using one or more proposed write-assist data lines falls within the scope of the present invention.

By making the write-assist data lines NDL have a first voltage transition from a current voltage level to a lower voltage level, an adjacent data line (e.g., WT or WC) has a second voltage transition from a current voltage level to a lower voltage level that is induced by the first voltage transition via capacitive coupling between the write-assist data line NDL and the adjacent data line (e.g., WT or WC). As mentioned above, differential bit lines of an SRAM cell are coupled to the differential data lines WT and WC during a write operation of the SRAM cell. Hence, during a write operation of the SRAM cell, a bit line that is coupled to the data line (e.g., WT or WC) with voltage transition also has a voltage transition from a current voltage level to a lower voltage level. In a case where the current voltage level of the bit line is a ground voltage level VSS (e.g., 0 mV), the lower voltage level of the bit line will be a negative voltage level (e.g., −125 mV). In this way, a negative bit line is achieved by capacitive coupling between the write-assist data line NDL and the adjacent data line (e.g., WT or WC) without using any MOS capacitor. That is, a charge-pumping capacitor is realized by capacitive coupling between the write-assist data line NDL and the adjacent data line (e.g., WT or WC), where the adjacent data line (e.g., WT or WC) is re-used as apart of the charge-pumping capacitor. Compared to the MOS capacitor, the write-assist data line NDL has a smaller area and a lower production cost. Further details of using global metal lines (e.g., one global data line WT/WC and one global write-assist data line NDL) and capacitive coupling to achieve a negative local bit line for an SRAM cell are described as below.

Figure 3:
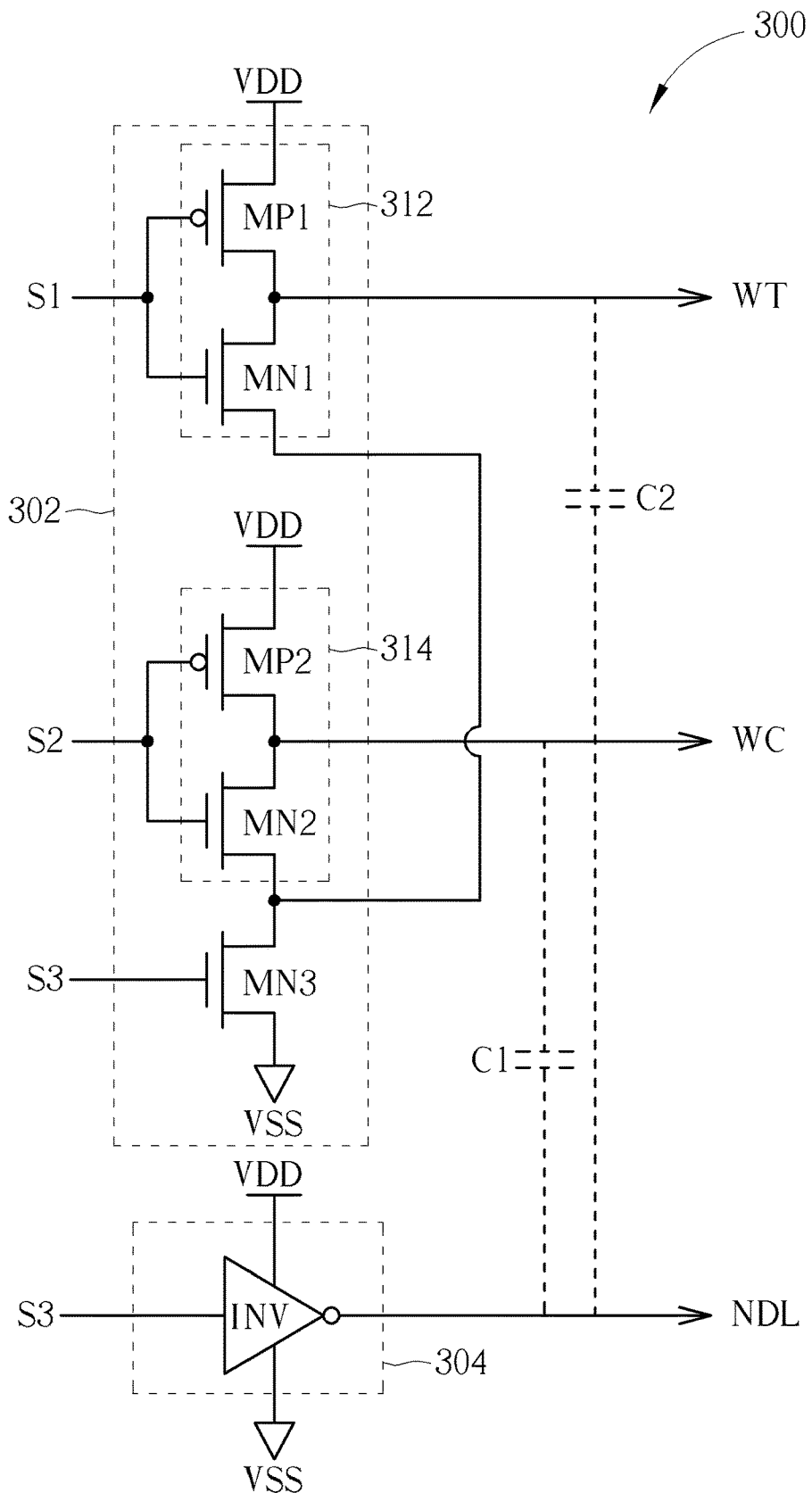
FIG. 3 is a circuit diagram of a data line control circuit according to an embodiment of the present invention.

FIG. 3 is a circuit diagram of a data line control circuit according to an embodiment of the present invention. The data line control circuit 300 is coupled to differential data lines WT and WC and one write-assist data line NDL, and may be a part of any of the global I/O circuits 108_1-108_3 shown in FIG. 1. In this embodiment, the data line control circuit 300 includes a data line driving circuit 302 and a write-assist data line driving circuit 304. The data line driving circuit 302 is arranged to drive the differential data lines WT and WC that are complementary to each other under a write mode. The write-assist data line driving circuit 304 is arranged to drive at least one write-assist data line NDL. The data line driving circuit 302 has a first driving circuit 312 used for driving the data line WT under control of a first control signal S1, a second driving circuit 314 used for driving the data line WC under control of a second control circuit S2, and an NMOS transistor MN3 used for enabling a floating ground at one data line under control of a third control signal S3. In this embodiment, the first driving circuit 312 is implemented by an inverter consisting of a PMOS transistor MP1 and an NMOS transistor MN1, and the second driving circuit 314 is implemented by an inverter consisting of a PMOS transistor MP2 and an NMOS transistor MN2.

The source of the PMOS transistor MP1 is coupled to the supply voltage level VDD, the drain of the PMOS transistor MP1 is coupled to the data line WT, the gate of the PMOS transistor MP1 is arranged to receive the first control signal S1. The drain of the NMOS transistor MN1 is coupled to the data line WT, the source of the NMOS transistor MN1 is coupled to the source of the NMOS transistor MN2 and the drain of the NMOS transistor MN3, and the gate of the NMOS transistor MN1 is arranged to receive the first control signal S1.

The source of the PMOS transistor MP2 is coupled to the supply voltage level VDD, the drain of the PMOS transistor MP2 is coupled to the data line WC, the gate of the PMOS transistor MP2 is arranged to receive the second control signal S2. The drain of the NMOS transistor MN2 is coupled to the data line WC, the source of the NMOS transistor MN2 is coupled to the source of the NMOS transistor MN1 and the drain of the NMOS transistor MN3, and the gate of the NMOS transistor MN2 is arranged to receive the second control signal S2.

The drain of the NMOS transistor MN3 is coupled to the source of the NMOS transistor MN1 and the source of the NMOS transistor MN2, the source of the NMOS transistor MN3 is coupled to the ground voltage level VSS, and the gate of the NMOS transistor MN3 is arranged to receive the third control signal S3.

The write-assist data line driving circuit 304 is implemented using an inverter INV having an input node arranged to receive a fourth control signal S4 and an output node coupled to the write-assist data line NDL.

The first control signal S1, the second control signal S2, the third control signal S3, and the fourth control signal S4 may be set by a write control circuit (not shown). Hence, with proper settings of the first control signal S1, the second control signal S2, the third control signal S3, and the fourth control signal S4, a negative bit line for one SRAM cell under a write mode can be achieved by global metal lines (e.g., WT/WC and NDL) and associated capacitive coupling.

Figure 4:
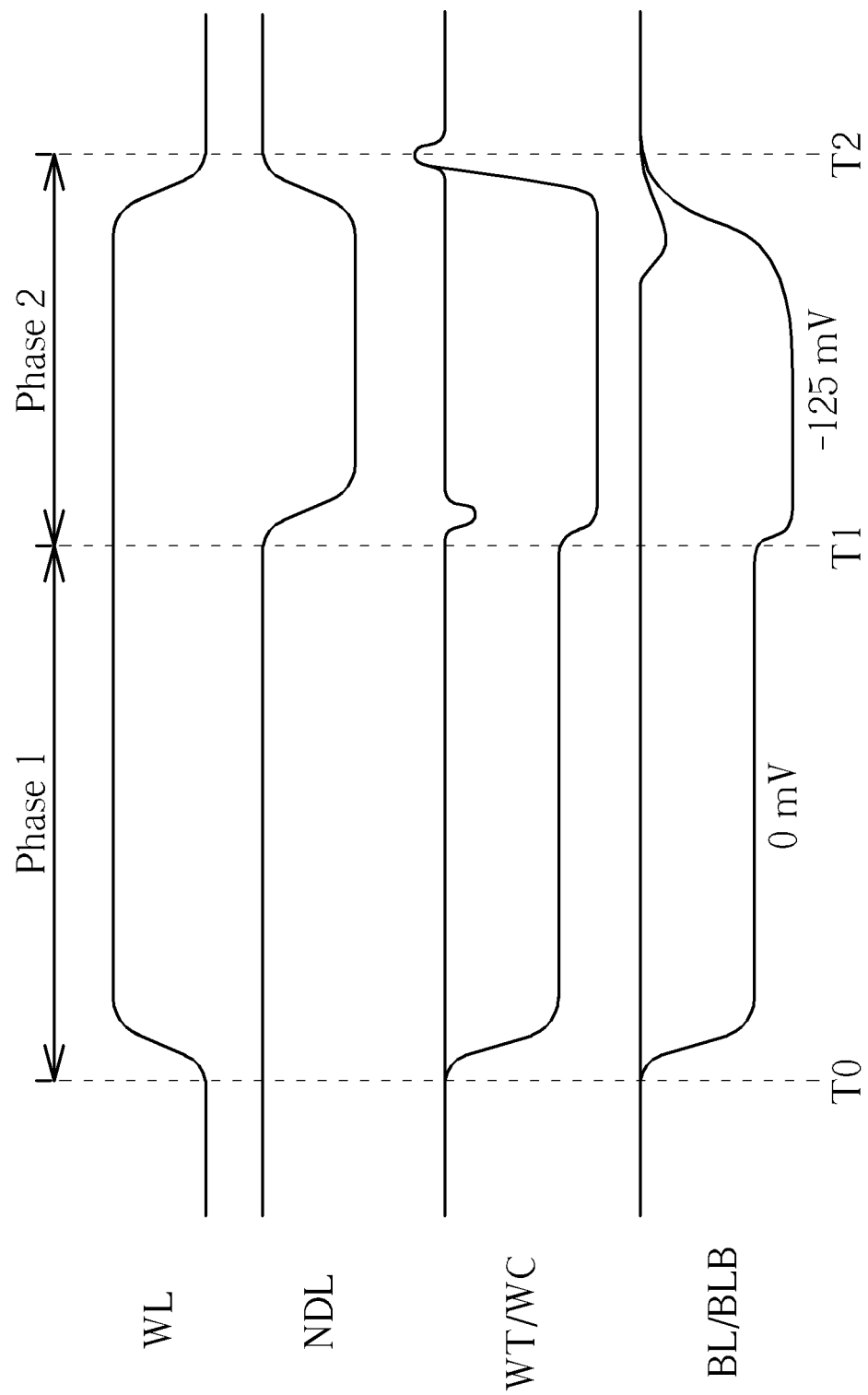
FIG. 4 is a diagram illustrating waveforms of voltage levels at a word line, a write-assist data line, differential data lines, and differential bit lines according to an embodiment of the present invention.

Please refer to FIG. 4 in conjunction with FIG. 3. FIG. 4 is a diagram illustrating waveforms of voltage levels at the word line WL, the write-assist data line NDL, the differential data lines WT and WC, and differential bit lines BL and BLB according to an embodiment of the present invention. Before a write operation of an SRAM cell is activated, the word line WL has a logic low level (e.g., ground voltage level VSS), and each of the write-assist data line NDL, the differential data lines WT and WC, and differential bit lines BL and BLB has a logic high level (e.g., supply voltage level VDD).

At time T0, the write operation of the SRAM cell begins. Hence, the word line WL is driven by a word line driving circuit to a logic high level (e.g., supply voltage level VDD) for turning on access transistors (pass-gate transistors) of the SRAM cell under the write mode. In this embodiment, the write operation of the SRAM cell is divided into a first phase (denoted by "Phase 1") during an interval T0-T1 and a second phase (denoted by "Phase 2") during an interval T1-T2. The first phase is a driving phase, and the second phase is a pumping (or capacitive coupling) phase following the driving phase.

When a bit "0" is required to be written into the SRAM cell, a first data line selected from differential data lines WT and WC is required to be driven to the supply voltage level VDD, while a second data line selected from the differential data lines WT and WC is required to be driven to the supply voltage level VDD. When a bit "1" is required to be written into the SRAM cell, the first data line is required to be driven to the ground voltage level VSS, while the second data line is required to be driven to the supply voltage level VDD. For example, the data line WT is driven to the supply voltage level VDD and the data line WC is driven to the ground voltage level VSS for writing a bit "0" into the SRAM cell, and the data line WT is driven to the ground voltage level VSS and the data line WC is driven to the supply voltage level VDD for writing a bit "1" into the SRAM cell. For another example, the data line WT is driven to the ground voltage level VSS and the data line WC is driven to the supply voltage level VDD for writing a bit "0" into the SRAM cell, and the data line WT is driven to the supply voltage level VDD and the data line WC is driven to the ground voltage level VSS for writing a bit "1" into the SRAM cell.

Consider a first case where the data line WT is required to be driven to the ground voltage level VSS and the data line WC is required to be driven to the supply voltage level VDD for writing one bit into the SRAM cell. During the first phase of the write operation, the first control signal S1 is set by a logic low level (e.g., supply voltage level VDD), the second control signal S2 is set by a logic low level (e.g., ground voltage level VSS), the third control signal S3 is set by a high logic level (e.g., supply voltage level VDD), and the fourth control signal S4 is set by a low logic level (e.g., ground voltage level VSS). Hence, the write-assist data line NDL maintains at the supply voltage level VDD driven by the inverter INV. In addition, the NMOS transistors MN1, MN3 and the PMOS transistor MP2 are turned on, and the PMOS transistor MP1 and the NMOS transistor MN2 are turned off. The first driving circuit 312 drives the data line WT to the ground voltage level VSS via the turned-on NMOS transistor MN1. The second driving circuit 314 drives the data line WC to the supply voltage level VDD via the turned-on PMOS transistor MP2.

During the second phase of the write operation, the first control signal S1 is set by a logic high level (e.g., supply voltage level VDD), the second control signal S2 is set by a logic low level (e.g., ground voltage level VSS), the third control signal S3 is set by a logic low level (e.g., ground voltage level VSS), and the fourth control signal S4 is set by a logic high level (e.g., supply voltage level VDD). Hence, the NMOS transistor MN3 is turned off, thus resulting in a floating ground at the data line WT. That is, the data line WT may keep floating during the second phase of the write operation. Since the PMOS transistor MP2 is still turned on by the second control signal S2, the second driving circuit 314 keeps driving the data line WC to the supply voltage level VDD. However, the write-assist data line NDL has a voltage transition from a current voltage level (e.g., supply voltage level VDD) to a lower voltage level (e.g., ground voltage level). Since the data line WT has a floating ground status and there is capacitive coupling (represented by a capacitor C2) between the data line WT and the write-assist data line NDL (which is isolated from the differential data lines WT and WC), the data line WT has a voltage transition from a current voltage level (e.g., ground voltage level VSS) to a lower voltage level (e.g., a negative voltage level) that is induced by the voltage transition of the write-assist data line NDL via the capacitive coupling between the write-assist data line NDL and the data line WT. As shown in FIG. 2, the data line WT is coupled to the bit line BL and the data line WC is coupled to the bit line BLB during the write operation of the SRAM cell. Since a negative voltage level is created at the data line WT by charge pumping, the bit line BL of the SRAM cell is a negative bit line (i.e., a bit line with a negative voltage level) for writing one bit into the SRAM cell.

There is also capacitive coupling (represented by a capacitor C1) between the data line WC and the write-assist data line NDL (which is isolated from the differential data lines WT and WC). Since the PMOS transistor MP2 keeps driving the data line WC to the supply voltage level VDD and the data line WC is coupled to the bit line BLB via an NMOS transistor which passes a weak "1", the bit line BLB is immune to a small voltage ripple at the data line WC that is caused by the capacitive coupling between the data line WC and the write-assist data line NDL and the voltage transition of the write-assist data line NDL.

Consider a second case where the data line WT is required to be driven to the supply voltage level VDD and the data line WC is required to be driven to the ground voltage level VSS for writing one bit into the SRAM cell. During the first phase of the write operation, the first control signal S1 is set by a logic low level (e.g., ground voltage level VSS), the second control signal S2 is set by a logic high level (e.g., supply voltage level VDD), the third control signal S3 is set by a logic high level (e.g., supply voltage level VDD), and the fourth control signal S4 is set by a logic low level (e.g., ground voltage level VSS). Hence, the write-assist data line NDL maintains at the supply voltage level VDD driven by the inverter INV. In addition, the NMOS transistors MN2, MN3 and the PMOS transistor MP1 are turned on, and the PMOS transistor MP2 and the NMOS transistor MN1 are turned off. The first driving circuit 312 drives the data line WT to the supply voltage level VDD via the turned-on PMOS transistor MP1. The second driving circuit 314 drives the data line WC to the ground voltage level VSS via the turned-on NMOS transistor MN2.

During the second phase of the write operation, the first control signal S1 is set by a logic low level (e.g., ground voltage level VSS), the second control signal S2 is set by a logic high level (e.g., supply voltage level VDD), the third control signal S3 is set by a logic low level (e.g., ground voltage level VSS), and the fourth control signal S4 is set by a logic high level (e.g., supply voltage level VDD). Hence, the NMOS transistor MN3 is turned off, thus resulting in a floating ground at the data line WC. That is, the data line WC may keep floating during the second phase of the write operation. Since the PMOS transistor MP1 is still turned on by the first control signal S1, the first driving circuit 312 keeps driving the data line WT to the supply voltage level VDD. However, the write-assist data line NDL has a voltage transition from a current voltage level (e.g., supply voltage level VDD) to a lower voltage level (e.g., ground voltage level). Since the data line WC has a floating ground status and there is capacitive coupling (represented by the capacitor C1) between the data line WC and the write-assist data line NDL (which is isolated from the differential data lines WT and WC), the data line WC has a voltage transition from a current voltage level (e.g., ground voltage level VSS) to a lower voltage level (e.g., a negative voltage level) that is induced by the voltage transition of the write-assist data line NDL via the capacitive coupling between the write-assist data line NDL and the data line WC. As shown in FIG. 2, the data line WT is coupled to the bit line BL and the data line WC is coupled to the bit line BLB during the write operation of the SRAM cell. Since a negative voltage level is created at the data line WT by charge pumping, the bit line BLB of the SRAM cell is a negative bit line (i.e., a bit line with a negative voltage level) for writing one bit into the SRAM cell.

There is also capacitive coupling (represented by the capacitor C2) between the data line WT and the write-assist data line NDL (which is isolated from the differential data lines WT and WC). Since the PMOS transistor MP1 keeps driving the data line WT to the supply voltage level VDD and the data line WT is coupled to the bit line BL via an NMOS transistor which passes a weak "1", the bit line BL is immune to a small voltage ripple at the data line WT that is caused by the capacitive coupling between the data line WT and the write-assist data line NDL and the voltage transition of the write-assist data line NDL.

The arrangement of the data lines WT, WC and the write-assist data line NDL shown in FIG. 3 is for illustrative purposes only. In practice, the data lines WT, WC and the write-assist data line NDL are global metal lines that may be properly routed to ensure that the capacitive coupling between the data line WT and the write-assist data line NDL and the capacitive coupling between the data line WC and the write-assist data line NDL have the same capacitance value. In this way, a layout with a minimum area requirement of global metal lines WT, WC, NDL can be achieved.

With the help of the write-assist data line and the wire coupling, a negative bit line of an SRAM cell is generated due to a negative data line. In other words, the proposed write-assist scheme is capable of providing a negative voltage to a bit line (e.g., BL or BLB) without using MOS capacitor(s), where a charge-pumping capacitor can be realized by capacitive coupling between at least one global write-assist data line (e.g., NDL) and one re-used global data line (e.g., WT or WC). Since the write-assist data line (e.g., NDL) and the re-used data lines (e.g., WT and WC) are global metal lines routed to multiple banks of the SRAM, the same write-assist circuit can be shared by multiple banks of the SRAM.

In above embodiments, the proposed write-assist scheme is employed by an SRAM design. However, this is for illustrative purposes only, and is not meant to be a limitation of the present invention. Any memory design using the proposed write-assist scheme falls within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A data line control circuit comprising:
 a data line driving circuit, arranged to drive differential data lines during a write operation of at least one memory cell, wherein the differential data lines comprise a first data line and a second data line; and during the write operation of said at least one memory cell, differential bit lines of said at least one memory cell are coupled to the differential data lines, respectively; and
 a write-assist data line driving circuit, arranged to drive at least one write-assist data line during the write operation of said at least one memory cell, wherein during the write operation of said at least one memory cell, said at least one write-assist data line is isolated from the differential data lines and is driven to have a first voltage transition from a first voltage level to a second voltage level, and one of the first data line and the second data line has a second voltage transition from a third voltage level to a fourth voltage level that is induced by the first voltage transition via capacitive coupling between said at least one write-assist data line and said one of the first data line and the second data line;
 wherein when the write operation is arranged to write a first logic value into said at least one memory cell, the first data line has the second voltage transition that is induced by the first voltage transition via capacitive coupling between the first data line and said at least one write-assist data line; when the write operation is arranged to write a second logic value into said at least one memory cell, the second data line has the second voltage transition that is induced by the first voltage transition via capacitive coupling between the second data line and said at least one write-assist data line; and said at least one write-assist data line comprises a same write-assist data line that is involved in both of induction of the second voltage transition at the first data line and induction of the second voltage transition at the second data line.

2. The data line control circuit of claim 1, wherein the second voltage level is lower than the first voltage level, and the fourth voltage level is lower than the third voltage level.

3. The data line control circuit of claim 2, wherein the fourth voltage level is a negative voltage level.

4. The data line control circuit of claim 2, wherein the first voltage level is equal to a supply voltage level, and the second voltage level and the third voltage level are equal to a same ground voltage level.

5. The data line control circuit of claim 1, wherein the third voltage level is identical to the second voltage level; the write operation of said at least one memory cell comprises a first phase and a second phase following the first phase; during the first phase, the data line driving circuit is arranged to drive said one of the first data line and the second data line to the second voltage level and drive another of the first data line and the second data line to the first voltage level, and the write-assist data line driving circuit is arranged to drive said at least one write-assist data line to the first voltage level; and during the second phase, the data line driving circuit is arranged to keep said one of the first data line and the second data line floating and keep driving said another of the first data line and the second data line to the first voltage level, and the write-assist data line driving circuit is arranged to drive said at least one write-assist data line to the second voltage level.

6. The data line control circuit of claim 1, wherein the third voltage level is identical to the second voltage level, and the data line driving circuit comprises:
 a first driving circuit, comprising:
  a first P-channel metal-oxide-semiconductor (PMOS) transistor, wherein a source of the first PMOS transistor is coupled to the first voltage level, a drain of the first PMOS transistor is coupled to said one of the first data line and the second data line, and a gate of the first PMOS transistor is arranged to receive a first control signal; and
  a first N-channel metal-oxide-semiconductor (NMOS) transistor, wherein a drain of the first NMOS transistor is coupled to said one of the first data line and the second data line, and a gate of the first NMOS transistor is arranged to receive the first control signal;
 a second driving circuit, comprising:
  a second PMOS transistor, wherein a source of the second PMOS transistor is coupled to the first voltage level, a drain of the second PMOS transistor is coupled to said another of the first data line and the second data line, and a gate of the second PMOS transistor is arranged to receive a second control signal; and
  a second NMOS transistor, wherein a drain of the second NMOS transistor is coupled to said another of the first data line and the second data line, and a gate of the second NMOS transistor is arranged to receive the second control signal; and
 a third NMOS transistor, wherein a gate of the third NMOS transistor is arranged to receive a third control signal, a source of the third NMOS transistor is coupled to the second voltage level, and a drain of the third NMOS transistor is coupled to both of a source of the first NMOS transistor and a source of the second NMOS transistor.

7. The data line control circuit of claim 6, wherein the write operation of said at least one memory cell comprises a first phase and a second phase following the first phase; during the first phase, the third NMOS transistor is turned on by the third control signal; and during the second phase, the third NMOS transistor is turned off by the third control signal.

8. The data line control circuit of claim 1, wherein the capacitive coupling between the first data line and said at least one write-assist data line and the capacitive coupling between the second data line and said at least one write-assist data line have a same capacitance value.

9. The data line control circuit of claim 1, wherein each of said at least one memory cell is a static random access memory (SRAM) cell.

10. The data line control circuit of claim 1, wherein the differential data lines and said at least one write-assist data line are shared by multiple memory banks.

11. A data line control method comprising:
   driving differential data lines during a write operation of at least one memory cell, wherein the differential data lines comprise a first data line and a second data line; and during the write operation of said at least one memory cell, differential bit lines of said at least one memory cell are coupled to the differential data lines, respectively; and
   driving at least one write-assist data line during the write operation of said at least one memory cell, wherein during the write operation of said at least one memory cell, said at least one write-assist data line is isolated from the differential data lines and is driven to have a first voltage transition from a first voltage level to a second voltage level, and one of the first data line and the second data line has a second voltage transition from a third voltage level to a fourth voltage level that is induced by the first voltage transition via capacitive coupling between said at least one write-assist data line and said one of the first data line and the second data line;
   wherein when the write operation is used to write a first logic value into said at least one memory cell, the first data line has the second voltage transition that is induced by the first voltage transition via capacitive coupling between the first data line and said at least one write-assist data line; when the write operation is used to write a second logic value into said at least one memory cell, the second data line has the second voltage transition that is induced by the first voltage transition via capacitive coupling between the second data line and said at least one write-assist data line; and said at least one write-assist data line comprises a same write-assist data line that is involved in both of induction of the second voltage transition at the first data line and induction of the second voltage transition at the second data line.

12. The data line control method of claim 11, wherein the second voltage level is lower than the first voltage level, and the fourth voltage level is lower than the third voltage level.

13. The data line control method of claim 12, wherein the fourth voltage level is a negative voltage level.

14. The data line control method of claim 12, wherein the first voltage level is equal to a supply voltage level, and the second voltage level and the third voltage level are equal to a same ground voltage level.

15. The data line control method of claim 11, wherein the third voltage level is identical to the second voltage level; the write operation of said at least one memory cell comprises a first phase and a second phase following the first phase;
   driving the differential data lines comprises:
      during the first phase, driving said one of the first data line and the second data line to the second voltage level, and driving another of the first data line and the second data line to the first voltage level; and
      during the second phase, keeping said one of the first data line and the second data line floating, and keeping driving said another of the first data line and the second data line to the first voltage level; and
   driving said at least one write-assist data line comprises:
      during the first phase, driving said at least one write-assist data line to the first voltage level; and
      during the second phase, driving said at least one write-assist data line to the second voltage level.

16. The data line control method of claim 11, wherein the capacitive coupling between the first data line and said at least one write-assist data line and the capacitive coupling between the second data line and said at least one write-assist data line have a same capacitance value.

17. The data line control method of claim 11, wherein each of said at least one memory cell is a static random access memory (SRAM) cell.

18. The data line control method of claim 11, further comprising:
   sharing the differential data lines and said at least one write-assist data line with multiple memory banks.

* * * * *